United States Patent
Jin et al.

(10) Patent No.: US 9,477,903 B2
(45) Date of Patent: *Oct. 25, 2016

(54) GRID DATA PROCESSING METHOD AND APPARATUS

(71) Applicant: International Business Machines Corporation, Armonk, NY (US)

(72) Inventors: Feng Jin, Shanghai (CN); Jun Mei Qu, Beijing (CN); Qi Ming Tian, Beijing (CN); Ya Nan Zhang, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/747,791

(22) Filed: Jun. 23, 2015

(65) Prior Publication Data

US 2016/0019436 A1 Jan. 21, 2016

Related U.S. Application Data

(63) Continuation of application No. 14/670,907, filed on Mar. 27, 2015.

(30) Foreign Application Priority Data

Mar. 28, 2014 (CN) .......................... 2014 1 0124281

(51) Int. Cl.
*G06K 9/00* (2006.01)
*G06K 9/62* (2006.01)
(Continued)

(52) U.S. Cl.
CPC .............. *G06K 9/62* (2013.01); *G01R 31/327* (2013.01); *G06K 9/00* (2013.01); *G06K 9/6282* (2013.01);
(Continued)

(58) Field of Classification Search
None
See application file for complete search history.

(56) References Cited

U.S. PATENT DOCUMENTS 5,136,248 A 8/1992 Maraio et al.
8,138,766 B2 3/2012 Abdul Karim et al.

FOREIGN PATENT DOCUMENTS

CN 2597997 1/2004
CN 201014998 1/2008
(Continued)

OTHER PUBLICATIONS

Min et al., "Still Image Remore Monitoring Upon EHV Power Towers," http://en.cnki.com.cn/Article_en/CJFDTOTAL-DLXT200418009.htm, abstract only, last printed Mar. 27, 2015.
(Continued)

*Primary Examiner* — Shervin Nakhjavan
(74) *Attorney, Agent, or Firm* — Scully, Scott, Murphy & Presser, P.C.; David Quinn, Esq.

(57) ABSTRACT

The present invention discloses a grid data record processing method. The method comprising: acquiring influence parameters of lag time of an insulator on which flashover is occurred, the lag time being a time interval from the insulator flashover to tripping of a corresponding breaker in a substation is caused; determining the lag time according to the acquired influence parameters of the lag time and a lag time evaluation model; and determining trip-up records caused by the insulator flashover from grid data records according to the lag time. With the method and apparatus according to embodiments of the present invention, trip-up records caused by insulator flashover can be efficiently determined from grid data records.

7 Claims, 3 Drawing Sheets

(51) Int. Cl.
*G01R 31/327* (2006.01)
*G06N 5/00* (2006.01)
*G06T 1/00* (2006.01)
*G06T 11/00* (2006.01)
*G06T 7/00* (2006.01)
*G06N 5/02* (2006.01)

(52) U.S. Cl.
CPC ............... *G06N 5/00* (2013.01); *G06T 1/0007* (2013.01); *G06T 7/0032* (2013.01); *G06T 11/001* (2013.01); *G06N 5/025* (2013.01); *G06T 2207/10004* (2013.01); *G06T 2207/30232* (2013.01); *G06T 2207/30244* (2013.01); *G06T 2210/61* (2013.01)

(56) References Cited

FOREIGN PATENT DOCUMENTS

| | | |
|---|---|---|
| CN | 202110239 | 1/2012 |
| CN | 102708472 | 10/2012 |

OTHER PUBLICATIONS

Dhahbi-Megriche et al., "Flashover Dynamic Model of Polluted Insulators under ac Voltage," 2000 IEEE Transactions on Dielectrics and Electrical Insulation, vol. 7, No. 2, Apr. 2000, pp. 283-289.
List of IBM Patents or Patent Applications Treated as Related.

GRID DATA PROCESSING METHOD AND APPARATUS

CROSS REFERENCE TO RELATED APPLICATION

This application is a continuation of U.S. patent application Ser. No. 14/670,907, filed Mar. 27, 2015 the entire content and disclosure of which is incorporated herein by reference.

BACKGROUND

The present invention relates to technical solution of grid data processing, and in particularly, to a method and apparatus for processing grid data according to information about insulator flashover.

It is a common phenomenon in a grid that tripping of switch occurs in a substation, and the time to re-close the switch after tripping is very short, usually in milliseconds, thus an external user usually will not sense the power failure, however, trip-up record is one kind of important grid data. Since tripping occurs frequently, the resultant trip-up records are usually of massive volume. For example, for a city-scale substation, trip-up records per day will be as many as several hundreds of thousands of pieces. Therefore, how to accurately analyze grid data having massive volume of trip-up records becomes a challenge in electric power field.

Typically, tripping events are recorded in grid data, especially in a SCADA system. There are many causes for tripping, such as overloaded line, aging facilities, flashover of insulator, etc., in which 70% of the tripping events are caused by insulator flashover. Many meaningful tripping failure records will be mixed among a vast number of tripping events caused by flashover, thus, efficient analysis could not be performed on tripping records, which, in turn, becomes a significant interference and seriously hinders analysis on grid data.

Currently, determining causes of tripping events is performed manually, for example, by manually checking other operation status recording system to see whether there is line overload at the time at which tripping occurs, or by manually collecting statistics about lines where tripping occurs frequently, and then checking whether there is aging facility, whether insulator flashover has occurred, etc. In electric power field, since the amount of data of trip-up records is very huge, and efficiency of existing manual checking is very low, there is an urgent need to provide an efficient technique for determining trip-up records caused by flashover.

Therefore, there is still room to improve existing grid data processing solution, and there is a need to efficiently determine trip-up records caused by insulator flashover from grid data records, thereby providing effective assistance to subsequently improve grid data analysis.

SUMMARY

According to one aspect of the present invention, there is provided a grid data record processing method, comprising: acquiring influence parameters of lag time of an insulator on which flashover is occurred, the lag time being a time interval from the insulator flashover to tripping of a corresponding breaker in a substation is caused; determining the lag time according to the acquired influence parameters of the lag time and a lag time evaluation model; and determining trip-up records caused by the insulator flashover from grid data records according to the lag time.

According to another aspect of the present invention, there is provided a grid data record processing apparatus, comprising: an acquiring module configured to acquire influence parameters of lag time of an insulator on which flashover is occurred, the lag time being a time interval from the insulator flashover to tripping of a corresponding breaker in a substation is caused; an evaluation module configured to determine the lag time according to the acquired influence parameters of the lag time and a lag time evaluation model; and a determining module configured to determine trip-up records caused by the insulator flashover from grid data records according to the lag time.

With the method and apparatus according to the invention, trip-up records caused by insulator flashover can be efficiently determined from grid data records, thereby providing effective assistance to subsequently improve grid data analysis.

BRIEF DESCRIPTION OF THE SEVERAL VIEWS OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
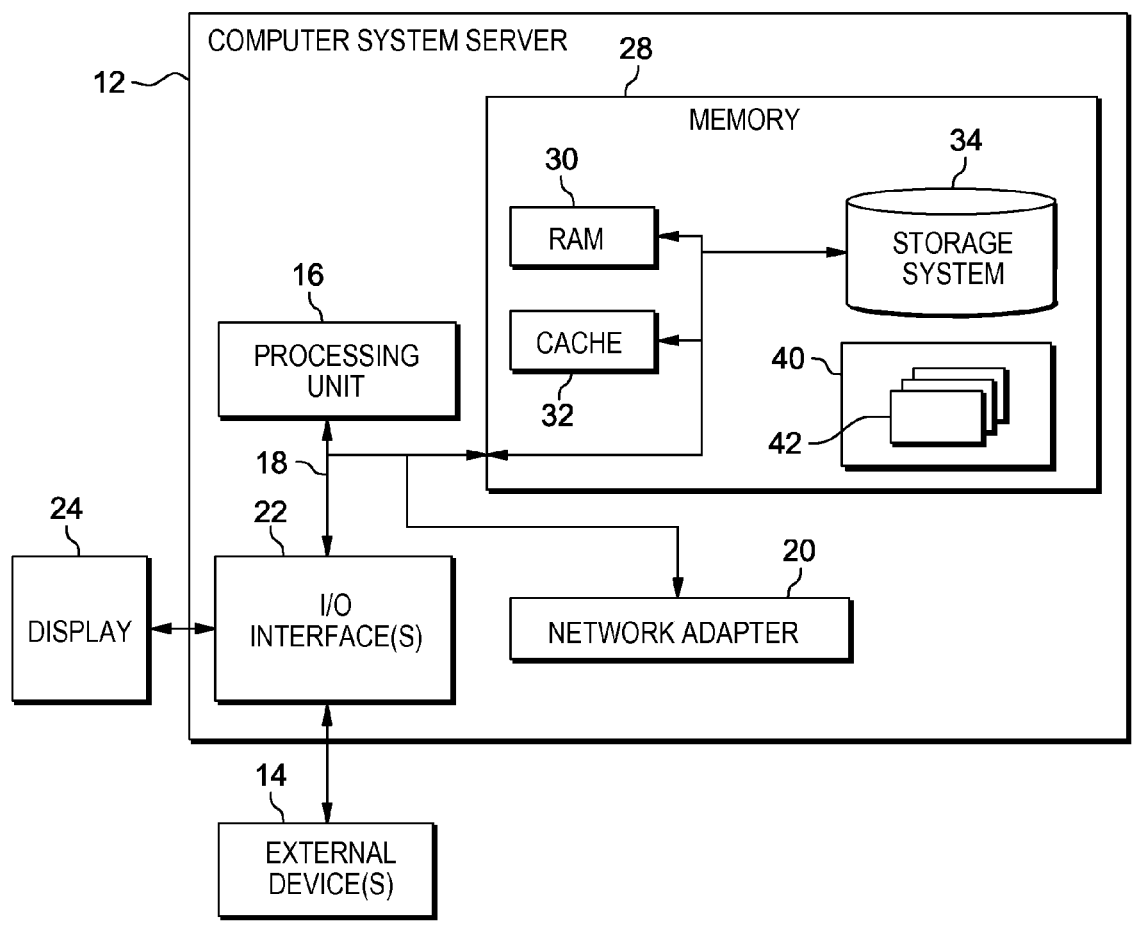
FIG. 1 shows a block diagram of an exemplary computer system/server 12 which is applicable to implement the embodiments of the present invention.

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, in some embodiments, the present invention may take the form of a computer program product embodied in one or more computer readable medium(s) having computer readable program code embodied therein.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, in which a block diagram of an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
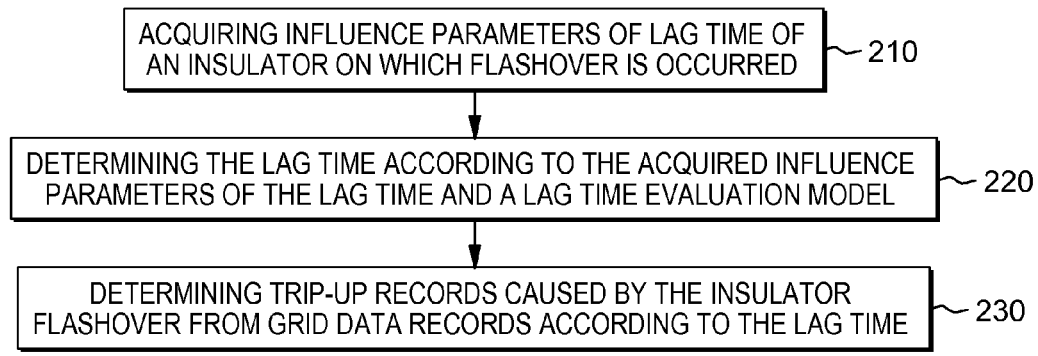
FIG. 2 depicts a flowchart of a grid data record processing method according to one embodiment of the present invention.

With reference to FIG. 2, a flowchart of a grid data record processing method according to one embodiment of the present invention is shown, generally, grid data record is SCADA data record.

As shown, the method at least comprising: step 210, acquiring influence parameters of lag time of an insulator on which flashover is occurred, the lag time being a time interval from the insulator flashover to tripping of a corresponding breaker in a substation is caused; step 220, determining the lag time according to the acquired influence parameters of the lag time and a lag time evaluation model; and step 230, determining trip-up records caused by the insulator flashover from grid data records according to the lag time.

In step 210, influence parameters of lag time of an insulator on which flashover is occurred are acquired, the lag time being a time interval from the insulator flashover to tripping of a corresponding breaker in a substation is caused.

Figure 3A:
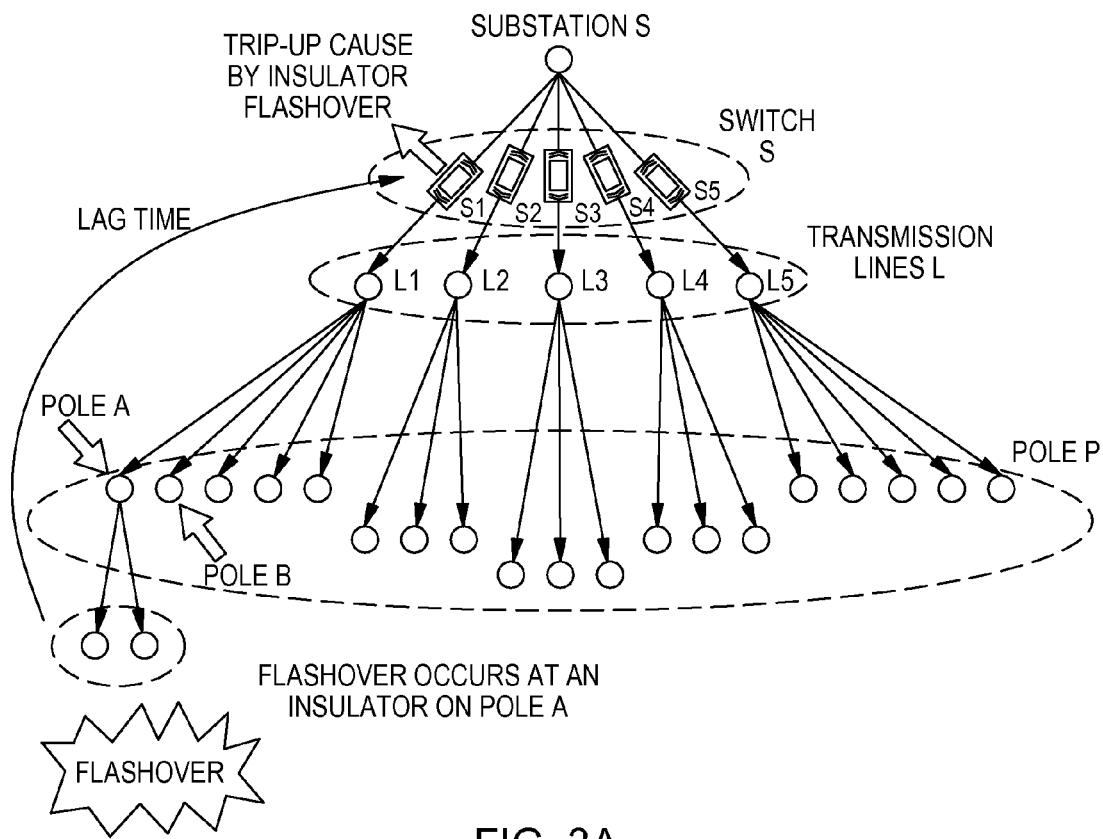
FIG. 3A depicts a logical diagram of a substation and transmission lines.
Figure 3B:
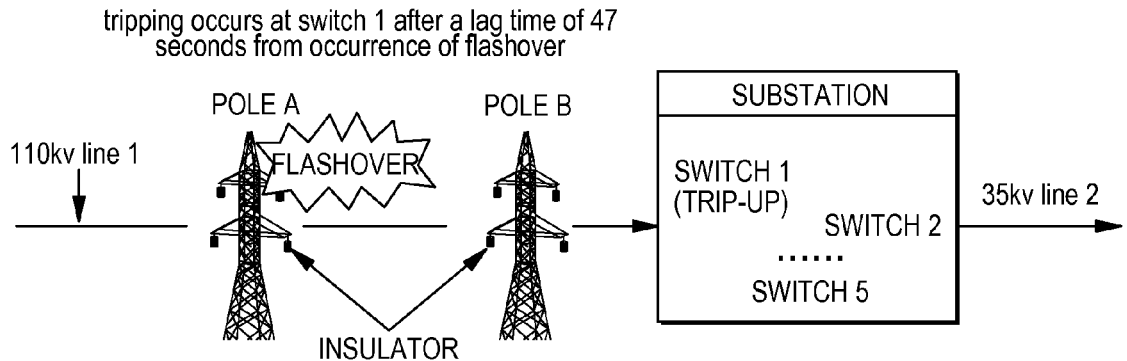
FIG. 3B depicts a diagram of physical structure of the substation and transmission lines.

Next, the lag time and the influence parameters of the lag time will be described in connection with FIG. 3A and FIG. 3B. FIG. 3A depicts a logical diagram of a substation and transmission lines, and FIG. 3B depicts a diagram of physical structure of the substation and transmission lines. In FIG. 3A, there is a plurality of breaker switches S (S1 ... S6) in substation S, and the transmission lines L (L1 ... Lb) connected with the substation are transmission paths leading to the substation, each of the transmission lines includes a plurality of poles on which a plurality of insulators are provided. Specifically, with respect to the physical structural diagram in FIG. 3, line 1 may be a 110 kv line inputted to the substation, line 1 is connected with switch 1 in the substation, and there is a plurality of poles (pole A, pole B, etc.) on line 1, each of the poles is provided with a plurality of insulators, and length of the line is the distance from the insulator on which flashover is occurred to the substation. There is also a 35 kV line 2 outputted from the substation, and likewise, line 2 also includes a plurality of poles, each of which also has a plurality of insulators.

When flashover occurs on an insulator, certain lag time is needed for the SCADA system to observe whether tripping of a corresponding breaker in the substation occurs, this is due to certain time interval is needed for the interference caused by variation in parameters such as voltage, current, and so on resulted from the flashover to be propagated to an adjacent substation and cause trip-up. Specifically, the process that there is a lag time between occurrence of the flashover and tripping in the substation can be known from FIG. 3 as follows: flashover occurs at an insulator on pole A, variation in current and voltage caused by the flashover is passed to switch 1 in the substation along a line having certain length, thereby causing tripping of switch 1, the lapsed time therebetween is referred to as lag time $\Delta t$.

The influence parameters of the lag time are various parameters that will influence the lag time, and specifically, may include one or more of the following: type of the flashover, time of the flashover, line length from an adjacent substation determined by physical location of the insulator, type of switch breaker, and status parameters of the insulator before the flashover.

Type of flashover is an important factor that will influence lag time, and variation in current and voltage caused by flashover with different phenomena will vary. In one embodiment, type of flashover may be divided as follows: 1) no apparent discharge; 2) purple spark, light purple silk-like discharge; 3) purple brush-like discharge; 4) orange segmental arc; 5) pulse frequency reduced, $\frac{1}{3}$ leakage distance; 6) bright orange main arc, with intensive little arcs in groove; 7) strong discharge, throughout leakage distance; 8) red arc. Type of flashover may be subdivided or merged by a person skilled in the art based on the information of the present disclosure.

Figure 4:
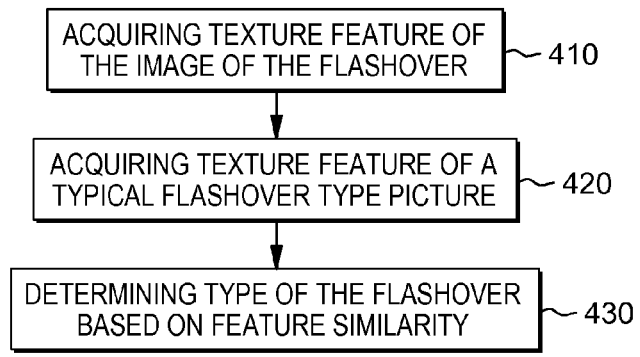
FIG. 4 depicts a flowchart of determining type of flashover by manner of image recognition according to one embodiment of the present invention.

In one more specific embodiment, acquiring type of the insulator flashover comprises: acquiring an image of the flashover when the flashover occurs on the insulator, for example, an image upon occurrence of the insulator flashover can be gathered by an image sensor; and type of the flashover may be determined by performing image recognition on the acquired image. FIG. 4 depicts a specific embodiment of a method for determining type of flashover by manner of image recognition. The method as shown in FIG. 4 comprising: step 410, extracting texture feature of the image of the flashover; step 420, acquiring texture feature of a typical flashover type picture; and step 430, determining type of the flashover based on feature similarity between the texture feature of the image of the flashover and that of the typical flashover type picture of an insulator. Specifically, the similarity may be determined by using cosine distance. Image recognition technique is not what is improved in the invention and details of its implementation will be omitted herein. Image acquiring devices may be arranged in many manners, for example, they may be arranged at each pole, or an image acquiring device may be commonly used between adjacent poles to reduce hardware cost. The time at which the flashover occurs may also be determined according to time stamp of the acquired image.

The status parameter of an insulator is, for example, contamination status of the insulator, and specifically, may include salt density, ash density, and so on. In one embodiment, contamination status of an insulator may be determined through contamination profile of the insulator, which is data commonly provided in a grid, and contamination status of an insulator can be determined by querying contamination profile according to location of the insulator. In another embodiment, contamination status of an insulator can also be learned by analyzing the image obtained before the flashover.

Line length is the distance from an insulator to an adjacent substation, which is also a factor positively related with lag time. A certain pole on an individual transmission line can be located according to physical location (latitude and longitude) of an insulator on which flashover occurs, and in turn the line to which it belongs and corresponding substation can be determined, thereby length of the line from that insulator to the substation can be determined A breaker in a substation is normally closed, and response time of different types of switches to interference will vary, therefore, type of switch is also a factor that will influence lag time. The type of switch includes, for example, vacuum breaker, compressed air breaker, oil breaker, and so on.

Next, step 220 in FIG. 2 will be described, wherein the lag time is determined according to the acquired influence parameters of the lag time and a lag time evaluation model.

The lag time evaluation model can be trained according to sample data. When a new flashover event occurs, the lag time may be calculated by inputting corresponding influence parameters of the lag time. In one embodiment, the step of determining the lag time evaluation model comprises: acquiring training data, each entry therein includes the influence parameters of the lag time of a historical flashover event and corresponding lag time; training the lag time evaluation model according to the training data through at least one of a decision tree model, an regression model and a Bayes model.

Next, in one specific embodiment, the process for establishing a lag time evaluation model will be described by taking regression model as an example. The specific training steps are as follows.

First, training samples are determined according to historical data. In one embodiment, each piece of sample data in the training sample includes four influence parameters of lag time and corresponding lag time. Specifically, the influence parameters of the lag time may include: type of flashover Yi, length of the line L between an insulator on which flashover occurs and a tripped switch in substation, type of the tripped switch A (for example, vacuum breaker, compressed air breaker, oil breaker, etc), and status parameter of an insulator B (for example, a value characterizing contamination status of the insulator, such as salt density, ash density, etc). Next, a process for determining lag time $\Delta t$ between the time at which flashover occurs on an insulator and the time when tripping is recorded in the SCADA system in the sample data will be described. Generally, trip-up records caused by the insulator flashover are manually determined from the SCADA data records, each piece of record includes a tripping time t2, and further, a time difference between the flashover time t1 of the insulator and the abnormal record time t2 in the SCADA system is taken as the lag time $\Delta t = t2 - t1$.

Establishment of a regression model is just to determine mathematical relationship $\Delta t = f(L, Yi, A, B)$ between influence parameters of lag time and the lag time on basis of sample data. Since selection of the sample data possesses certain randomness, confidence verification needs to be conducted on the established model with the aid of other sample data, so as to derive a relationship model between variables having significant features. The confidence verification conducted in model establishment stage is theoretical verification having statistical sense. After the verified regression model is established, $\Delta t$ can be calculated according to the established regression model for newly generated L, Yi, A, and B records. According to the $\Delta t$ acquired from calculation, a portion of trip-up records in the SCADA system can be deleted, this portion of deleted SCADA records is considered as being caused by insulator flashover. To actually verify confidence level of the established regression model, result obtained through manual checking and that obtained through system's automatic checking needs to be compared, so as to obtain actual confidence level of the regression model. When the actually measured confidence level of the regression model meets a certain requirement, it proves that the established model has relative high accuracy, and can be used as a means to check the SCADA trip-up records; otherwise, the model needs to be re-established.

In another embodiment, the process for establishing a lag time evaluation model will be described by taking decision tree model as an example. The specific training steps are as follows.

First, training samples also need to be determined according to historical data, for details of which, please refer to the preparation of sample data employed by the regression model. Next, according to different feature variable (flashover type of an insulator, status parameter of an insulator, length of line, status parameter of a switch), information gain for that feature variable is calculated, the feature with large information gain of the feature variable is taken as a next level child node of the decision tree, and the decision tree is divided according to that feature variable. Further, training sets are located on different child nodes according to feature variables, and correspond to different sub-training sets. Then, the decision tree division step is performed iteratively, until the decision tree is grown to a predetermined decision depth (i.e. path length of the decision tree) threshold, that is, construct a relative complete decision tree. There are lag time for a plurality of sample data in each leaf node set of the decision tree, lag time feature of each leaf node set needs to be calculated according to lag time of these sample data. The calculation method includes but is not limited to clustering method (e.g., k-means method), weighted averaging method, and so on.

After establishment of the decision tree model, impurity degree of the finally obtained leaf node (number of records/total number of records which do not conform to clustering feature of the leaf nodes) is defined as theoretical confidence level of the decision tree model. When the theoretical confidence level of the decision tree model meets the requirement, this decision tree model can be taken as a model for predicting lag time; otherwise, the decision tree model needs to be re-established. Upon obtaining a decision tree model that meets the requirement, lag time $\Delta t$ for a new record is predicted based on this model, and whereby a portion of trip-up records in the SCADA system is deleted, this portion of deleted SCADA records is considered as being caused by insulator flashover. To actually verify confidence level of the resultant decision tree model, result obtained through manual checking and that obtained through system's automatic checking needs to be compared, so as to obtain actual confidence level of the decision tree model.

Of course, as appreciated by a person skilled in the art, there may be more, less or different influence parameter variables of lag time than that described above in the evaluation model. For example, the evaluation model may only include some of the above listed variables. Furthermore, as appreciated by a person skilled in the art, in addition to the above discussed logistic regression model, decision tree model, other classification model such as Bayes model can also be employed to establish the method training evaluation model, and the details of which will be omitted here for brevity.

When using the lag time evaluation model determined from the regression model, for a new insulation flashover, according to the obtained influence parameters of the lag time for that flashover (such as, flashover type Yi, line length L; switch type A; and insulator status parameter B) and the evaluation model $\Delta t=f(L, Yi, A, B)$, lag time $\Delta t$ corresponding to this new insulator flashover event can be calculated.

When using the lag time evaluation model determined from the decision tree model, for a new insulator flashover, according to the obtained influence parameters of the lag time of that flashover and the decision tree evaluation model, the new flashover can be classified to a certain leaf node of the decision tree, and in turn, lag time $\Delta t$ of this new insulator flashover event can be determined according to the lag time of that leaf node.

In step 230, trip-up records caused by the insulator flashover are determined from grid data records according to the lag time.

Generally, grid data record is original SCADA trip-up record. In one embodiment, SCADA trip-up records are filtered by lag time and flashover time. For example, a time window can be determined according to the lag time and the flashover time, and trip-up records caused by flashover can be determined from the grid data records according to this time window.

After step 230, in one embodiment, analysis may be performed on the determined trip-up records caused by flashover. In another embodiment, original data may be filtered by removing the trip-up records caused by flashover, in this manner, accident trip-up records in a grid not caused by flashover and have high confidence degree can be obtained, further, more meaningful analysis can be performed on the filtered data records. It is to be noted that, how to analyze grid data is not what is improved in the invention and details of which will be omitted herein.

The key to the present application lies in finding objective law of lag time and applying that objective law in grid data processing, which can provide significant assistance to substantially reduce interference by tripping events caused by flashover, or to specifically analyze tripping events caused by flashover.

Figure 5:
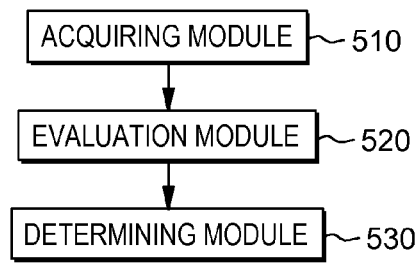
FIG. 5 depicts a diagram of a grid data record processing apparatus according to one embodiment of the present invention.

FIG. 5 depicts a diagram of a grid data record processing apparatus according to one embodiment of the present invention, the apparatus comprising: an acquiring module 510 configured to acquire influence parameters of lag time of an insulator on which flashover is occurred, the lag time being a time interval from the insulator flashover to tripping of a corresponding breaker in a substation is caused; an evaluation module 520 configured to determine the lag time according to the acquired influence parameters of the lag time and a lag time evaluation model; and a determining module 530 configured to determine trip-up records caused by the insulator flashover from grid data records according to the lag time.

In one embodiment, the influence parameters of the lag time includes at least one of the following: type of the flashover, time of the flashover, line length from an adjacent substation determined by physical location of the insulator, type of switch breaker, and status parameters of the insulator before the flashover.

In one embodiment, the acquiring module 510 comprises: a module configured to acquire an image of the flashover when the flashover occurs on the insulator; and a module configured to determine type of the flashover by performing image recognition on the acquired image.

In one embodiment, the module configured to determine type of the flashover by performing image recognition on the acquired image comprises: a module configured to acquire texture feature of the image of the flashover; and a module configured to determine type of the flashover based on similarity between the texture feature of the image of the flashover and that of a typical flashover type picture.

In one embodiment, the determining module 530 comprises: a module configured to determine a time window according to the lag time and the time at which the flashover occurs; and a module configured to determine trip-up records caused by the flashover according to the time window.

In one embodiment, the apparatus further comprising a module configured to determine the lag time evaluation model, and the module configured to determine the lag time evaluation model comprises: a module configured to acquire training data, each entry therein includes the influence parameters of the lag time of a historical flashover event and corresponding lag time; a module configured to train the lag time evaluation model according to the training data through at least one of a decision tree model, an regression model and a Bayes model.

In one embodiment, the apparatus further comprising a module configured to perform analysis on the trip-up records caused by the flashover.

In one embodiment, the apparatus further comprising a module configured to perform analysis on the grid data records from which the trip-up records caused by the flashover have been removed.

With the technical solution of the present application, trip-up records caused by flashover can be efficiently determined from grid data records. When the technical solution of the present application is implemented by the general-purpose computer system shown in FIG. 1, the computer system shown in FIG. 1 will become a dedicated device for processing grid data records.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A grid data record processing method, comprising:

acquiring, at a processor device of a computing system, influence parameters of lag time of an insulator on which flashover is occurred, the lag time being a time interval from the insulator flashover to tripping of a corresponding breaker in a substation is caused;

acquiring, at the processor device, an image of the flashover when the flashover occurs on the insulator;

determining, at the processor device, a type of the flashover by performing image recognition on the acquired image;

determining the lag time according to the acquired influence parameters of the lag time and a lag time evaluation model; and determining trip-up records caused by the insulator flashover from grid data records according to the lag time.

2. The method according to claim 1, wherein the influence parameters of the lag time includes at least one of the following:

type of the flashover, time of the flashover, line length from an adjacent substation determined by physical location of the insulator, type of switch breaker, and status parameters of the insulator before the flashover.

3. The method according to claim 1, wherein the step of determining type of the flashover by performing image recognition on the acquired image comprises:

acquiring texture feature of the image of the flashover;

determining type of the flashover based on similarity between the texture feature of the image of the flashover and that of a typical flashover type picture.

4. The method according to claim 1, wherein the step of determining trip-up records caused by the insulator flashover from grid data records according to the lag time comprises:

determining a time window according to the lag time and the time at which the flashover occurs;

determining trip-up records caused by the flashover according to the time window.

5. The method according to claim 1, further comprising a step of determining the lag time evaluation model, and the step of determining the lag time evaluation model comprises:

acquiring training data, each entry therein includes the influence parameters of the lag time of a historical flashover event and corresponding lag time;

training the lag time evaluation model according to the training data through at least one of a decision tree model, an regression model and a Bayes model.

6. The method according to claim 1, further comprising:

performing analysis on the trip-up records caused by the flashover.

7. The method according to claim 1, further comprising:

performing analysis on the grid data records from which the trip-up records caused by the flashover have been removed.

* * * * *